United States Patent
Hwang et al.

(10) Patent No.: US 10,109,760 B2
(45) Date of Patent: Oct. 23, 2018

(54) ELIMINATING EMISSIVE SUB-BANDGAP STATES IN NANOCRYSTALS

(71) Applicant: MASSACHUSETTS INSTITUTE OF TECHNOLOGY, Cambridge, MA (US)

(72) Inventors: Gyuweon Hwang, Cambridge, MA (US); Donghun Kim, Cambridge, MA (US); Jose M. Cordero, Cambridge, MA (US); Mark W. B. Wilson, Somerville, MA (US); Chia-Hao M. Chuang, Cambridge, MA (US); Jeffrey C. Grossman, Brookline, MA (US); Moungi G. Bawendi, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 5 days.

(21) Appl. No.: 15/095,001

(22) Filed: Apr. 8, 2016

(65) Prior Publication Data

US 2016/0336477 A1 Nov. 17, 2016

Related U.S. Application Data

(60) Provisional application No. 62/145,373, filed on Apr. 9, 2015.

(51) Int. Cl.
*H01L 31/18* (2006.01)
*H01L 31/036* (2006.01)
*H01L 31/032* (2006.01)
*H01L 31/0445* (2014.01)
*H01L 51/00* (2006.01)
*H01L 31/0352* (2006.01)
*H01L 51/42* (2006.01)

(52) U.S. Cl.
CPC ............ *H01L 31/18* (2013.01); *H01L 31/036* (2013.01); *H01L 31/0324* (2013.01); *H01L 31/035218* (2013.01); *H01L 31/0445* (2014.12); *H01L 51/0001* (2013.01); *H01L 51/0077* (2013.01); *H01L 51/42* (2013.01)

(58) Field of Classification Search
USPC ............................................... 556/81, 91, 97
See application file for complete search history.

(56) References Cited

U.S. PATENT DOCUMENTS

2013/0032767 A1* 2/2013 Manna ........................ 252/519.4

OTHER PUBLICATIONS

Bae (Journal of the American Chemical Society; 2012, 134, 20160-20168).*

* cited by examiner

*Primary Examiner* — Pancham Bakshi
(74) *Attorney, Agent, or Firm* — Steptoe & Johnson LLP

(57) ABSTRACT

The size-dependent band-gap tunability and solution processability of nanocrystals (NCs) make them attractive candidates for optoelectronic applications. One factor that presently limits the device performance of NC thin films is sub-bandgap states, also referred to as trap states. Trap states can be controlled by surface treatment of the nanocrystals.

19 Claims, 15 Drawing Sheets

FIG. 6A
FIG. 6B
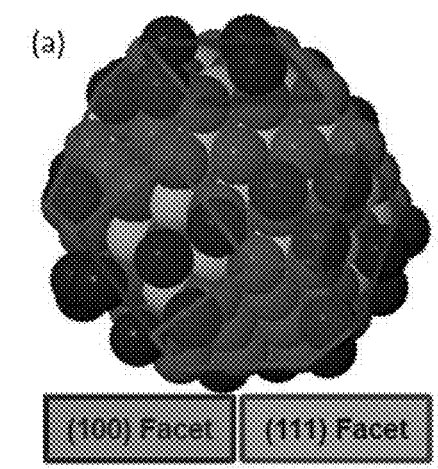
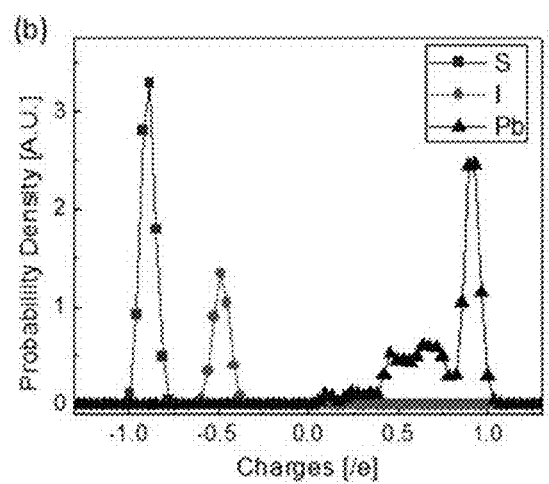
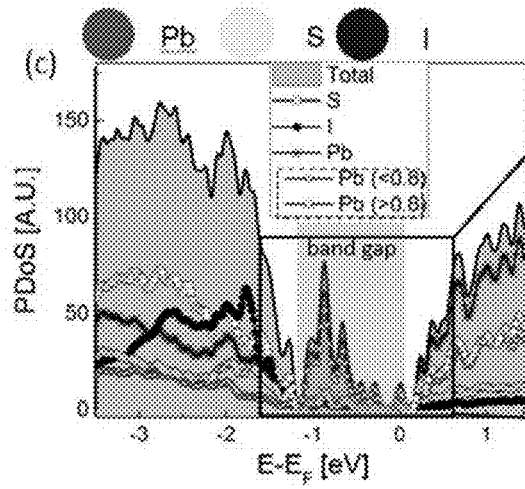
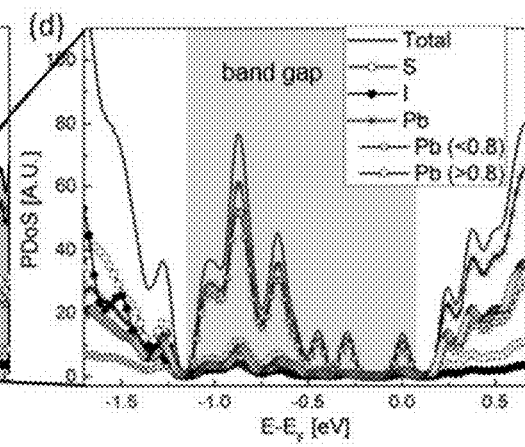
FIG. 6C
FIG. 6D (a)

(b)

FIG. 15A
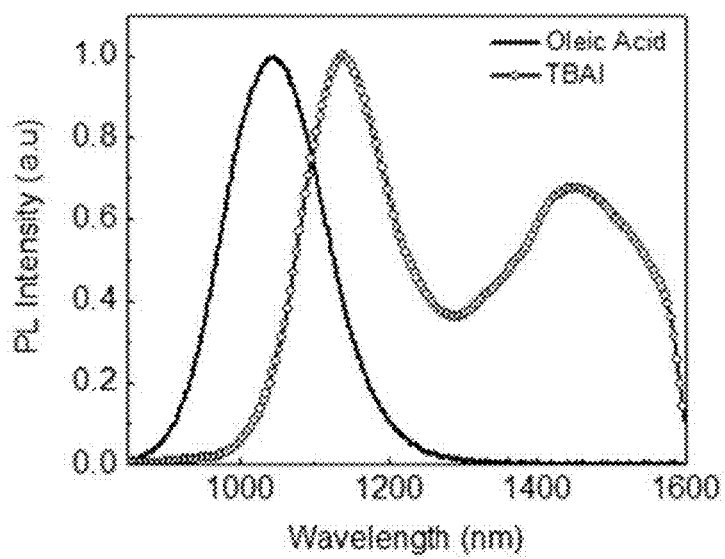
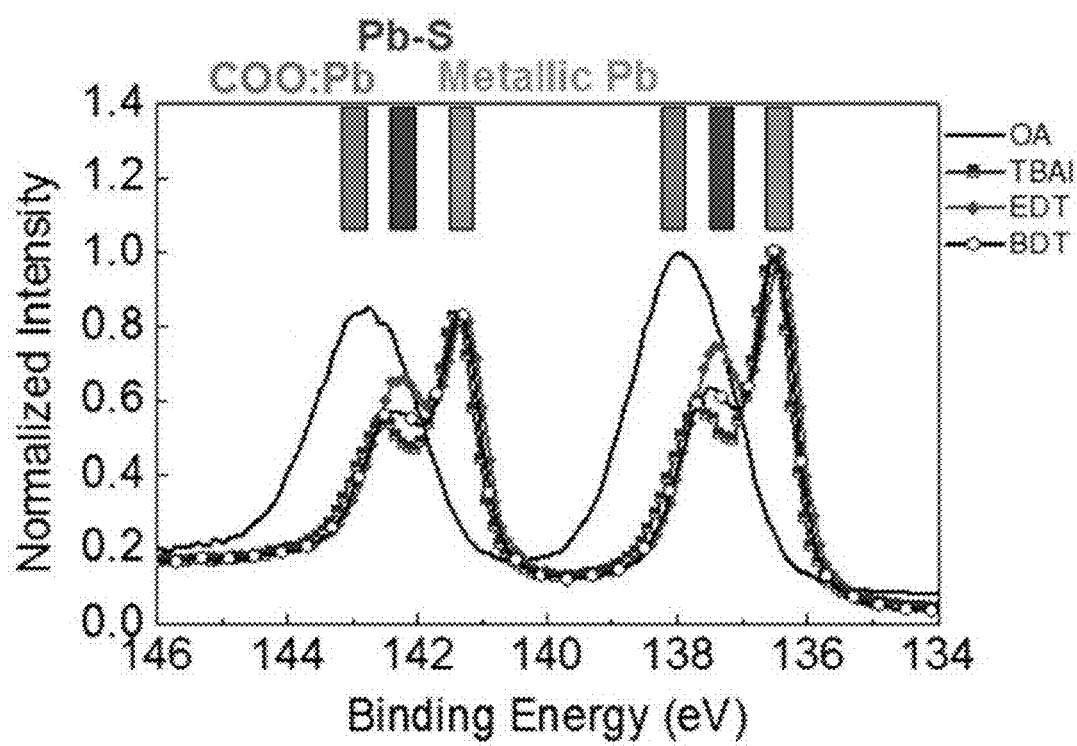
FIG. 15B

ELIMINATING EMISSIVE SUB-BANDGAP STATES IN NANOCRYSTALS

CLAIM OF PRIORITY

This application claims priority to U.S. Provisional Patent Application No. 62/145,373, filed Apr. 9, 2015, which is incorporated by reference in its entirety.

FEDERAL SPONSORSHIP STATEMENT

This invention was made with government support under Contract No. W911 NF-13-D-0001 awarded the Army Research Office and under Grant No. DE-SCOOO1088 awarded by the U.S. Department of Energy. The government has certain rights in the invention.

FIELD OF THE INVENTION

The invention relates to nanocrystal materials and methods of making them.

BACKGROUND

The size-dependent band-gap tunability and solution processability of nanocrystals (NCs) make them attractive candidates for optoelectronic applications. One factor that presently limits the device performance of NC thin films is sub-bandgap states, also referred to as trap states. An understanding of the mechanism can help improve device performance.

SUMMARY

In general, a method of modifying a surface of an MX nanocrystal includes contacting a surface of the nanocrystal with an oxidizing agent.

In another aspect, a method of treating a film that includes an MX nanocrystal comprising contacting a surface of the nanocrystal with an oxidizing agent.

In another aspect, a lead sulfide nanocrystal includes a nanocrystal having an oxidized surface such that the density of trap states for the nanocrystal having the oxidized surface to the nanocrystal having an untreated surface is reduced by at least 20-fold. The oxidized surface can be oxidized relative to the nanocrystal material away from the core.

In certain embodiments, M includes Pb. In certain embodiments, X can include S or Se.

In certain embodiments, the oxidizing agent can include 1,4-benzoquinone, dithiothreitol, 2,3-dichloro-5,6-dicyanobenzoquinone, 3,3',5,5'-tetra-tert-butyldiphenoquinone, di-tert-butyl peroxide, $I_2$, $I_2/I^-$ ($I_3^-$), chlorine gas, bromine, ozone, $O_2$ plasma treatment, or an acid. In certain embodiments, the oxidizing agent can include pyruvic acid and the method includes annealing.

In certain embodiments, contacting a surface of the nanocrystal with the oxidizing agent can increase the charge of M. For example, contacting the surface of the nanocrystal with the oxidizing agent can include dispensing the oxidizing agent onto the film.

Other aspects, embodiments, and features will be apparent from the following description, the drawings, and the claims.

BRIEF DESCRIPTION OF THE DRAWINGS

FIG. 6A depicts the truncated octahedron shape of the model PbS NC used for the DFT calculations. FIG. 6B depicts Bader charge analysis of the charge distribution for each element—Pb (line with triangle), S (line with square) and I (line with circle). FIG. 6C depicts the DoS (total, black) from DFT, broken into PDoS for each chemical species—S (empty square), I (filled circle), all Pb (line with *). The PDoS of Pb further subdivided—contributions from under-charged Pb atoms (<0.8, line with stars), and Pb atoms with a charge greater than 0.8 (line with triangles). FIG. 6D depicts an enlarged view (c) highlighting the DoS near the band gap.

FIGS. 11A-11B depict DFT results showing that iodine and fluorine ligands induce different suppression of under-charged Pb species and a different profile of sub-bandgap states.

FIG. 15A PL from PbS NC thin films with different ligands—oleic acids (line) and TBAI (line with square).

FIG. 15B depicts XPS on the Pb 4f feature for the PbS NC thin films with different ligands—OA (line), TBAI (line with half filled square), EDT (line with diamond shape), and BDT (line with circles). The binding energies of metallic Pb, Pb—S, and COO:Pb are marked on the top axis

DETAILED DESCRIPTION

Figures 1A, 1B:
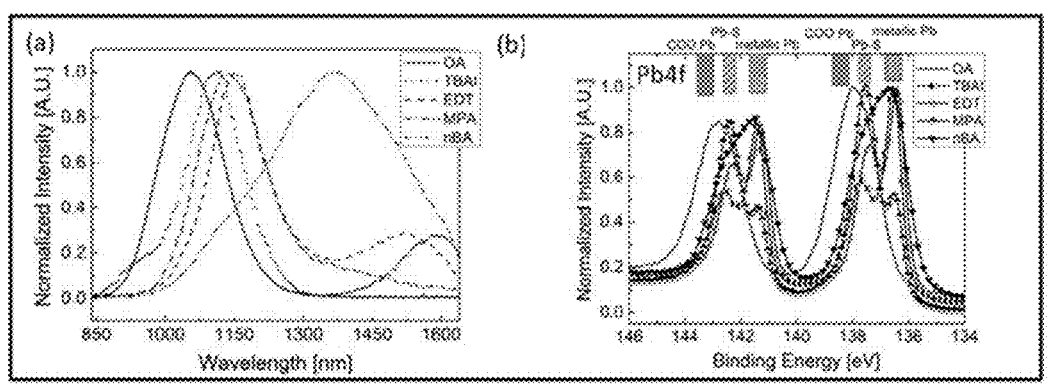
FIG. 1A depicts PL from PbS NC thin films with different ligands—OA (line), TBAI (dotted line), EDT (dashed line), MPA (dash-dot-line), and nBA (dash-dot-dot-line).
FIG. 1B depicts XPS on the Pb 4f feature for the same samples. The binding energies of metallic Pb, Pb—S, and COO:Pb are marked on top axis.

Chemical oxidation of under-charged Pb atoms can reduce the density of trap states by a factor of 40 in films of colloidal PbS nanocystals (NCs) for devices. These emissive sub-bandgap states can be created by ligand-exchange procedures. XPS measurements and density function theory simulations demonstrate that they are associated with under-charged Pb. 1. A method of modifying a surface of an MX nanocrystal can include contacting a surface of the nanocrystal with an oxidizing agent such as 1,4-benzoquinone, dithiothreitol, 2,3-dichloro-5,6-dicyanobenzoquinone, 3,3', 5,5'-tetra-tert-butyldiphenoquinone, di-tert-butyl peroxide, $I_2$, $I_2/I^-$ ($I_3^-$), chlorine gas, bromine, ozone, $O_2$ plasma treatment, or an acid, for example, $H_2SO_4$ or $HNO_3$. A method of treating a film that includes an MX nanocrystal can comprise contacting a surface of the nanocrystal with an oxidizing agent.

The semiconductor nanocrystals can have a broad absorption band with an intense, narrow band emission. The peak wavelength of emission can be tuned from throughout the visible and infrared regions, depending on the size, shape, composition, and structural configuration of the nanocrystals. The nanocrystals can be prepared with an outer surface having desired chemical characteristics (such as a desired solubility). Light emission by nanocrystals can be stable for long periods of time.

When a nanocrystal achieves an excited state (or in other words, an exciton is located on the nanocrystal), emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) for nanocrystals that emit in the visible can be observed. IR-emitting nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901 and 6,576,291, and U.S. Patent Application No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis (silyl) chalcogenide, dioxygen, an ammonium salt, or a tris(silyl) pnictide. Suitable X donors include dioxygen, bis(trimethylsilyl) selenide ((TMS)$_2$Se), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), bis (trimethylsilyl)sulfide ((TMS)$_2$S), a trialkyl phosphine sulfide such as (tri-n-octylphosphine) sulfide (TOPS), an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, carboxylic acids, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include oleic acids, pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The core can have an overcoating on a surface of the core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group I-III-VI compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

The size-dependent band-gap tunability and solution processability of nanocrystals (NCs) make them attractive candidates for optoelectronic applications. See, for example, J. Y. Kim, O. Voznyy, D. Zhitomirsky, E. H. Sargent, Adv. Mater. 2013, 25, 4986; G. Konstantatos, E. H. Sargent, Nat. Nanotechnol. 2010, 5, 391; I. J. Kramer, E. H. Sargent, Chem. Rev. 2014, 114, 863; D. V Talapin, MRS Bull. 2012, 37, 63; J. Tang, E. H. Sargent, Adv. Mater. 2011, 23, 12; M. V Kovalenko, L. Manna, A. Cabot, Z. Hens, D. V Talapin, C. R. Kagan, V. I. Klimov, A. L. Rogach, P. Reiss, D. J. Milliron, P. Guyot-Sionnnest, G. Konstantatos, W. J. Parak, T. Hyeon, B. A. Korgel, C. B. Murray, W. Heiss, ACS Nano 2015, 9, 1012; Y. Shirasaki, G. J. Supran, M. G. Bawendi, V. Bulovic, Nat Phot. 2013, 7, 13, each of which is incorporated by reference in its entirety. NCs have been actively explored for applications as light emitting diodes, photodetectors, and photovoltaics. See, for example, G. J. Supran, K. W. Song, G. W. Hwang, R. E. Correa, J. Scherer, E. A. Dauler, Y. Shirasaki, M. G. Bawendi, V. Bulovic, Adv. Mater. 2015, 27, 1437; J. Clifford, G. Konstantatos, Nat. Nanotechnol. 2008, 4, 40; S. M. Geyer, J. M. Scherer, N. Moloto, F. B. Jaworski, M. G. Bawendi, ACS Nano 2011, 5, 5566; C.-H. M. Chuang, P. R. Brown, V. Bulović, M. G. Bawendi, Nat. Mater. 2014, 13, 796; L.-Y. Chang, R. R. Lunt, P. R. Brown, V. Bulovic, M. G. Bawendi, Nano Lett. 2013, 13, 994, each of which is incorporated by reference in its entirety. However, further improvements in device performance are required to make them competitive. See, for example, D. Zhitomirsky, O. Voznyy, S. Hoogland, E. H. Sargent, ACS Nano 2013, 7, 5282; A. H. Ip, S. M. Thon, S. Hoogland, O. Voznyy, D. Zhitomirsky, R. Debnath, L.

Levina, L. R. Rollny, G. H. Carey, A. Fischer, K. W. Kemp, I. J. Kramer, Z. Ning, A. J. Labelle, K. W. Chou, A. Amassian, E. H. Sargent, Nat. Nanotechnol. 2012, 7, 577; D. D. Wanger, R. E. Correa, E. A. Dauler, M. G. Bawendi, Nano Lett. 2013, 13, 5907; D. Bozyigit, V. Wood, J. Mater. Chem. C 2014, 2, 3172; D. Zhitomirsky, O. Voznyy, L. Levina, S. Hoogland, K. W. Kemp, A. H. Ip, S. M. Thon, E. H. Sargent, Nat. Commun. 2014, 5, 3803; J. M. Berg, J. L. Tymoczkom, L. Stryer, Biochemistry, W. H. Freeman And Company, New York, 2002, each of which is incorporated by reference in its entirety. One factor that presently limits the device performance of NC thin films is sub-bandgap states, also referred to as trap states, which have been observed using optical field effect transistors and scanning tunneling spectroscopy. See, for example, P. Stadler, B. R. Sutherland, Y. Ren, Z. Ning, A. Simchi, S. M. Thon, S. Hoogland, E. H. Sargent, ACS Nano 2013, 7, 5757; G. H. Carey, I. J. Kramer, P. Kanjanaboos, G. Moreno-bautista, O. Voznyy, L. Rollny, J. A. Tang, S. Hoogland, E. H. Sargent, ACS Nano 2014, 8, 11763; P. Nagpal, V. I. Klimov, Nat. Commun. 2011, 2, 486; B. Diaconescu, L. A. Padilha, P. Nagpal, B. S. Swartzentruber, V. I. Klimov, Phys. Rev. Lett. 2013, 110, 127406, each of which is incorporated by reference in its entirety. These states, for instance, are thought to give rise to the open-circuit voltage deficit in photovoltaic applications, and cause a drastic decrease of charge carrier lifetimes and diffusion lengths. See, for example, C.-H. Chuang, A. Maurano, R. Brandt, G. W. Hwang, J. Jean, T. Buonassisi, V. Bulovic, M. G. Bawendi, Nano Lett. 2015, 15, 3286; D. Bozyigit, W. M. M. Lin, N. Yazdani, O. Yarema, V. Wood, Nat. Commun. 2015, 6, 6180; K. S. Jeong, J. Tang, H. Liu, J. Kim, A. W. Schaefer, K. Kemp, L. Levina, X. Wang, S. Hoogland, R. Debnath, L. Brzozowski, E. H. Sargent, J. B. Asbury, ACS Nano 2012, 6, 89, each of which is incorporated by reference in its entirety. A common view is that trap states are sub-bandgap surface states caused by dangling bonds or unpassivated surface atoms. See, for example, D. Bozyigit, S. Volk, O. Yarema, V. Wood, Nano Lett. 2013, 13, 5284; E. J. D. Klem, H. Shukla, S. Hinds, D. D. MacNeil, L. Levina, E. H. Sargent, Appl. Phys. Lett. 2008, 92, 212105; Z. Ning, Y. Ren, S. Hoogland, O. Voznyy, L. Levina, P. Stadler, X. Lan, D. Zhitomirsky, E. H. Sargent, Adv. Mater. 2012, 24, 6295, each of which is incorporated by reference in its entirety. Thus, previous approaches to reduce the density of traps have included attempts to exchange the binding groups of passivating ligands, increase the ligand coverage, or balance the stoichiometry at the dot surfaces. See, for example, D. Kim, D. H. Kim, J. H. Lee, J. C. Grossman, Phys. Rev. Lett. 2013, 110, 196802; S. J. Oh, N. E. Berry, J.-H. Choi, E. A. Gaulding, T. Paik, S.-H. Hong, C. B. Murray, C. R. Kagan, ACS Nano 2013, 7, 2413, each of which is incorporated by reference in its entirety. Sub-bandgap emission from PbS NC films treated with 3-mercaptopropionic acid (MPA) can be removed by further treatment with acidic solutions, especially pyruvic acid. Even though these treatments led to improved device performance, the lack of a fundamental understanding of the mechanism has impaired efforts to control trap states in general and, thereby, improve device performance. Here, x-ray photoelectron spectroscopy (XPS) and density functional theory (DFT) calculations were used to identify chemically reduced (or under-charged) Pb atoms as the origin of trap states in ligand-exchanged PbS NC thin films. Chemical oxidation was used to achieve a 40-fold reduction in the density of trap states by controlling the oxidation states of Pb atoms. The discovery of a chemical origin for the trap states in PbS films offers an opportunity to rationally control their density, and thereby to fabricate improved devices.

PbS NC thin films have been researched intensively for optoelectronic applications due to a tunable band gap energy that covers the ideal range used for photovoltaics and optical communications in the near infrared and short-wavelength infrared, as well as the availability of a straightforward, scalable synthesis. See, for example, M. Graetzel, R. A. J. Janssen, D. B. Mitzi, E. H. Sargent, Nature 2012, 488, 304; M. A. Hines, G. D. Scholes, Adv. Mater. 2003, 15, 1844, each of which is incorporated by reference in its entirety. As-synthesized (See Experimental Section), the NCs have bulky organic ligands, so it can be necessary to exchange these with smaller molecules to facilitate charge transport. Typical ligands used for the fabrication of NC devices include: 1,2-ethanedithiol (EDT), MPA, tetrabutylammonium iodide (TBAI), and n-butylamine (nBA).

EDT-, MPA-, and TBAI-treated PbS films were prepared by conventional solid-state ligand exchange procedures, and nBA-treated samples by an established solution-phase ligand exchange procedure. See, for example, P. R. Brown, D. Kim, R. R. Lunt, N. Zhao, M. G. Bawendi, J. C. Grossman, V. Bulović, ACS Nano 2014, 8, 5863; T. S. Mentzel, D. D. Wanger, N. Ray, B. J. Walker, D. Strasfeld, M. G. Bawendi, M. A. Kastner, Nano Lett. 2012, 12, 4404, each of which is incorporated by reference in its entirety. As seen in FIG. 1A, photoluminescence (PL) measurements show that additional sub-bandgap emission is observed following every ligand exchange process—independent of the binding group of the ligands. In detail, PbS NCs with native oleic acid ligands (OA, black) show only band edge emission at ca. 1050 nm. By contrast, TBAI (dotted line), EDT (dashed line), WA (dash-dot-line), and nBA (dash-dot-dot-line) treated samples show broad, but distinct emission peaks near 1500 nm, 1600 nm, and 1400 nm respectively, and the MPA-treated sample (orange) shows a long red tail. All these additional emissive features reside at lower energies than the band edge emission, which indicates that the newly formed emissive states are located inside the band gap. For the nBA-treated sample, it is noted that band edge emission near 1100 nm is considerably weaker than the trap emission, while the band edge emission for all ligand-exchanged samples are slightly red-shifted due to the increased dielectric environments and altered diffusion of photoexcitations induced by the shorter dot-to-dot distance. See, for example, P. Guyot-Sionnest, J. Phys. Chem. Lett. 2012, 3, 1169; J. Gao, J. C. Johnson, ACS Nano 2012, 6, 3292; J. Gao, J. Zhang, J. van de Lagemaat, J. C. Johnson, M. C. Beard, ACS Nano 2014, 8, 12814, each of which is incorporated by reference in its entirety.

Figure 2:
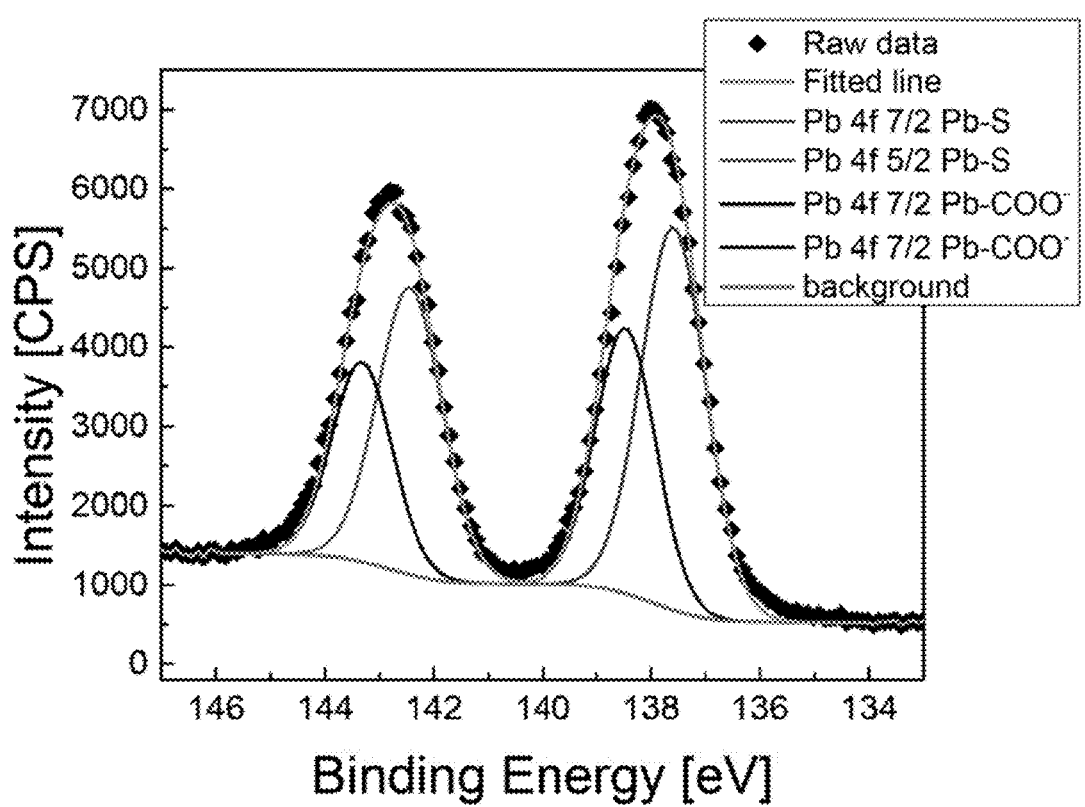
FIG. 2 depicts the deconvoluted spectrum of PbS NC thin films with native OA ligands. The spectrum is well fitted with the sum of the peaks from Pb—S and Pb-carboxylates.

To identify whether a chemical species is associated with this trap emission, high-resolution XPS was performed on each film, focusing on the Pb 4f spectral feature to obtain information on the bonding character of the Pb atoms (FIG. 1B). The expected spectral positions for three species are highlighted with colored bands: metallic Pb as tan, Pb—S as blue, and Pb-carboxylate as grey. Peak locations for Pb bonded to other ligands are not explicitly marked since these features are not prominent in the data, and are covered under the tails of Pb—S peaks. Before ligand exchange, the OA-coated film shows a single, relatively broad feature due to the overlap between the two peaks from Pb—S and Pb-carboxylates. The deconvoluted spectrum of the OA-coated NC film is shown in FIG. 2. See, for example, J. F. Moulder, W. F. Stickle, P. E. Sobol, K. D. Bomben, Handbook of X-Ray Photoelectron Spectroscopy, Perkin-Elmer Corporation, Eden Prairie, Minn., 1992; NIST X-ray Photoelectron Spectroscopy Database, Version 4.1 (National Institute of Standards and Technology, Gaithersburg, 2012), which is incorporated by reference in its entirety.

After ligand exchange, it was observed that the Pb-carboxylate features are diminished for all samples, and an additional peak evolves with a lower binding energy than either Pb—S or Pb-carboxylate bonds. The new peak corresponds to the binding energy of metallic Pb, which indicates that a few $Pb^{2+}$ atoms in Pb—S bonds have been chemically reduced to have less charge than regular Pb—S bonds. The consistent trend in the XPS results for each ligand implies that these additional emissive trap states are from reduced or 'under-charged' Pb atoms.

Figures 1C, 1D:
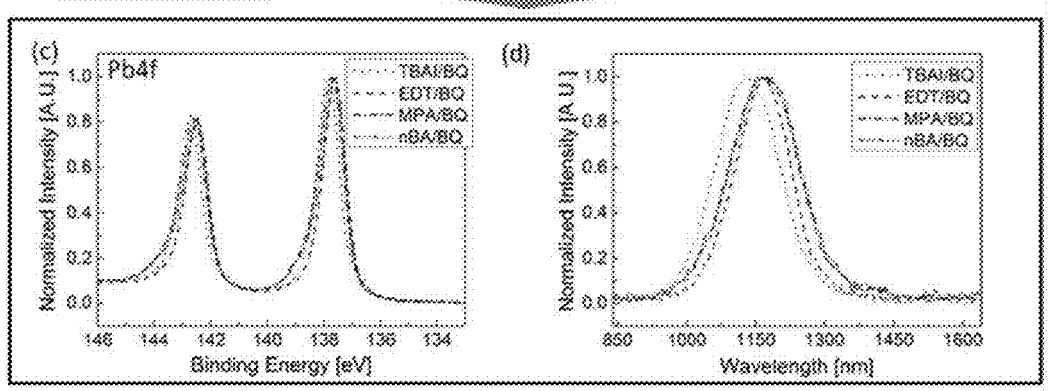
FIG. 1C depicts XPS and FIG. 1D depicts PL measurements of ligand-exchanged PbS NC thin films following oxidation with BQ.
Figure 3:
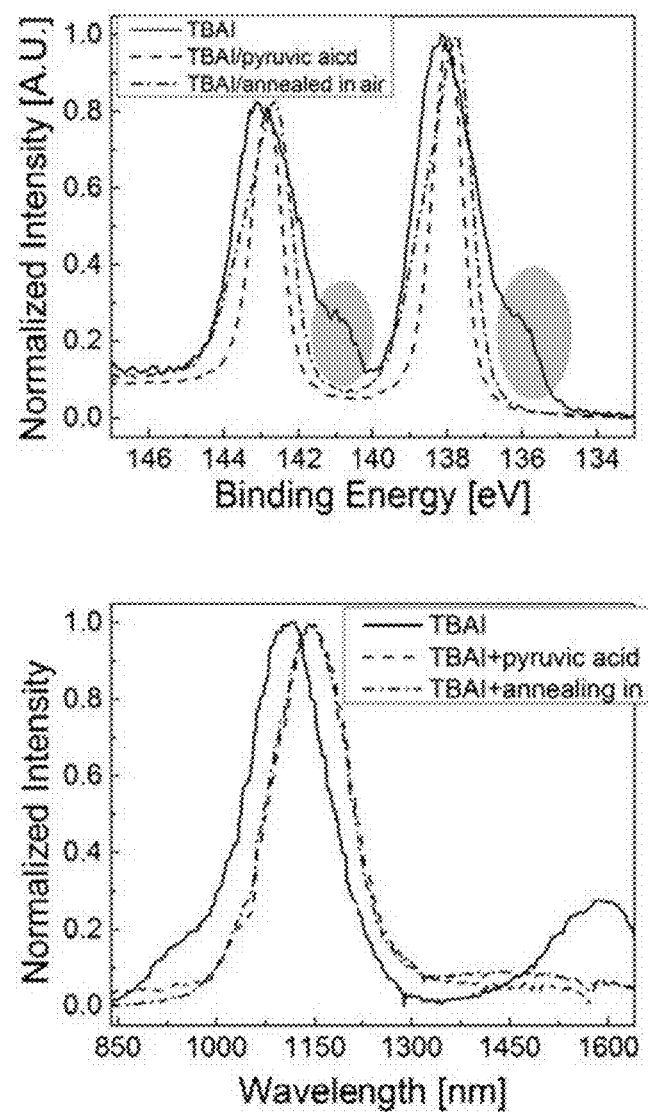
FIG. 3 depicts the XPS results (upper panel) of TBAI-treated PbS NC thin films with different oxidation methods: TBAI-treated films as a reference (black), TBAI-treated films followed by 0.8% (v/v) pyruvic acid treatment (dashed line), which is a oxidant in metabolic pathways in muscles, TBAI-treated films followed by annealing at 80° C. in air for 30 min (dash-dot-line). Less-charged Pb features (marked as grey) at the shoulder of Pb—S peak are disappeared with pyruvic acid treatment and air-annealing. The PL (lower panel) shows that the emission from sub-bandgap states removed after the treatment.
Figure 4:
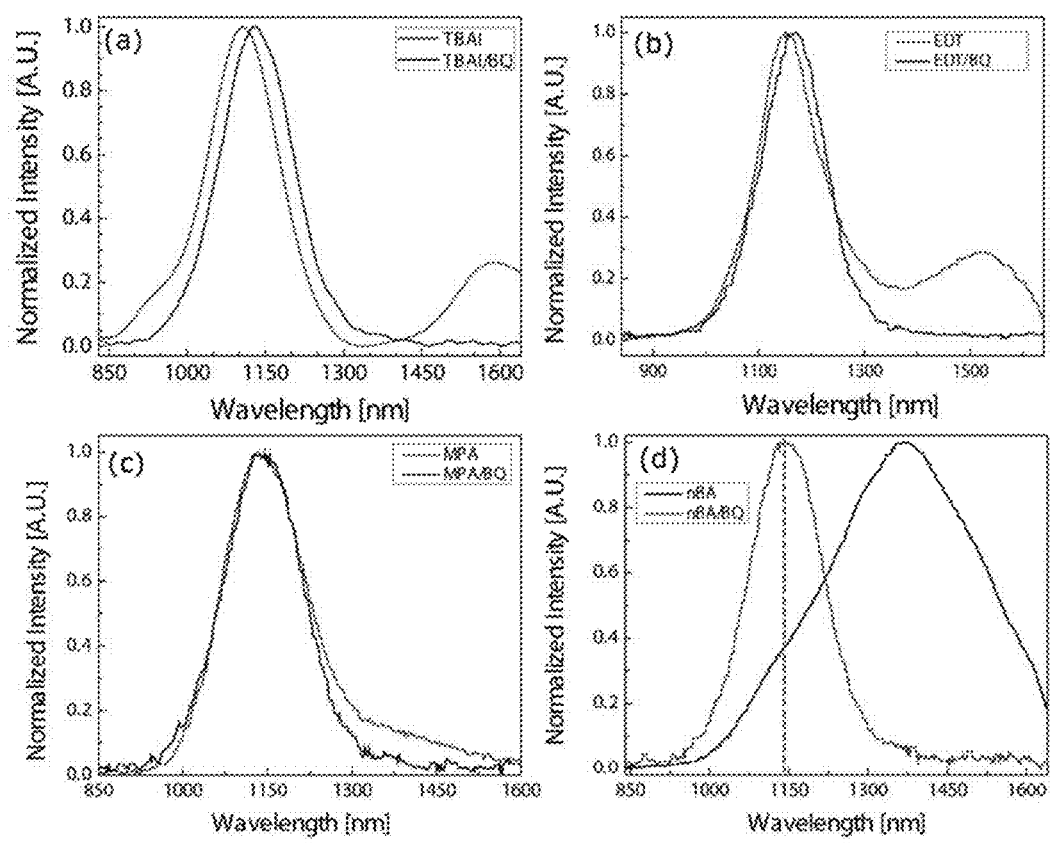
FIG. 4 depicts the comparison of each ligand treated sample before and after BQ treatment. PL from (panel a) TBAI- (panel b) EDT- (panel c) MPA- and (panel d) nBA-treated sample. A line was added for (panel d) for easy comparison of peak position for nBA/BQ-treated and peak shoulder position for nBA-treated sample.
Figure 5A:
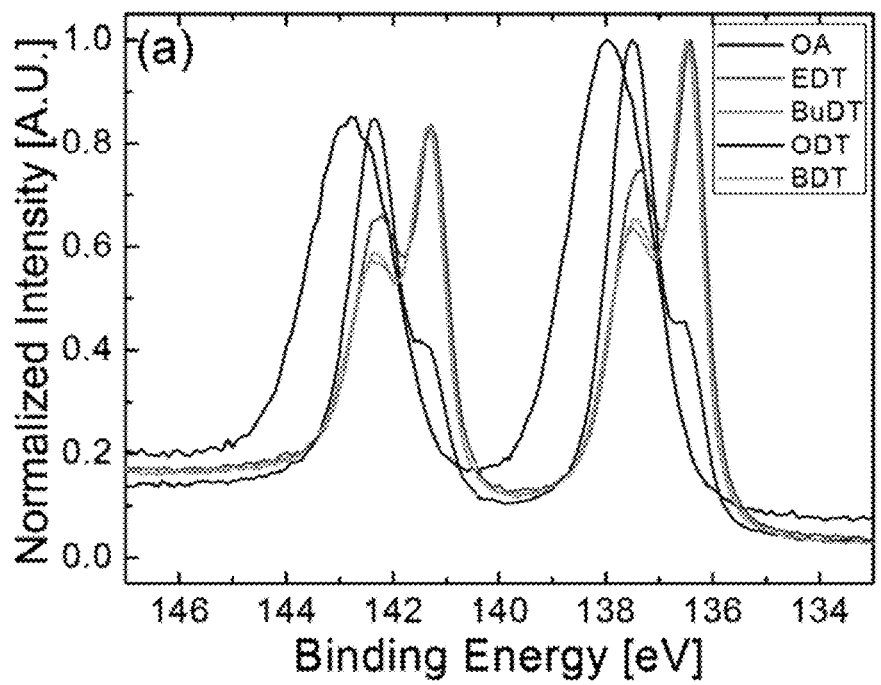
FIG. 5A depicts that the XPS results of PbS NC thin films with different length of dithiol ligands are compared with oleic acid (OA) ligand: 1,2-ethanedithiol (EDT), 1,4-butanedithiol (BuDT), 1,8-octanedithiol (ODT), and 1,3-benzendithiol (BDT). Under-charged Pb atoms exist regardless of the length of dithiol ligands.
Figure 5B:
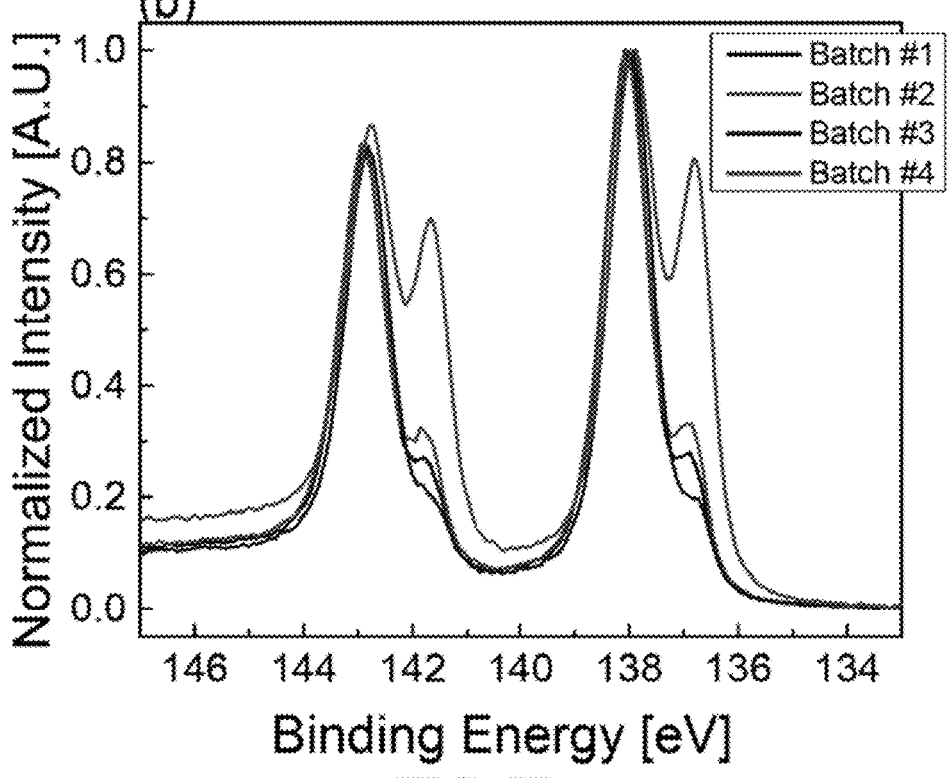
FIG. 5B depicts XPS results showing the under-charged Pb atoms in TBAI-treated PbS NCs from four different synthetic batches.

To verify whether the formation of under-charged Pb atoms contributes to the emissive sub-bandgap states, the ligand exchanged films were oxidized with a mild oxidizing agent, 1,4-benzoquinone (BQ). As shown in FIG. 1C, XPS measurements confirm that the BQ treatment successfully removes the under-charged Pb atoms. Further, after oxidation, all ligand-exchanged PbS NC films exhibit only band edge emission, as shown in FIG. 1D. This additional BQ treatment induces a modest (10-40%) decrease of the PL intensity relative to the ligand-exchanged films, with some dependence on processing conditions. Additional XPS results shown in FIG. 3 demonstrate that this effect can be achieved with other oxidation methods, such as pyruvic acid treatment and annealing in air. Of note, after air-annealing additional oxidation feature of Pb arises at higher binding energy than the Pb—S feature. These results all support a causal relationship between under-charged Pb and emissive trap states.

It is important to ensure that the removal of the emissive sub-bandgap states by BQ treatment is not due to an additional ligand exchange or a change in the ligand coverage. Compared to sulfur- and nitrogen-bearing ligands, TBAI-treated PbS NCs have the convenient property that the elemental signature of I is readily distinguishable in XPS experiments. As shown in Table 1, XPS measurements on TBAI-treated PbS NCs confirm that the I-to-Pb ratio remains constant after BQ treatment, which verifies that the ligand binding on NCs remains intact after the BQ treatment

TABLE 1

The atomic ratios of PbS NCs used in this work. Experimental data for the Pb-to-S ratio is obtained using WDS, and the I-to-Pb in TBAI-treated PbS NC thin films is measured using XPS. The ratios for the simulated NC used in DFT calculations for comparison are included.

| Samples | I/Pb ratio | Pb/S ratio |
|---|---|---|
| PbS:OA | n.a. | 1.58 ± 0.08 |
| PbS:TBAI | 0.336 ± 0.010 | 1.51 ± 0.14 |
| PbS:TBAI/BQ | 0.353 ± 0.016 | 1.45 ± 0.04 |
| Simulated PbS NCs | 0.302 | 1.47 |

To test the possibility that under-charged Pb atoms can form under these conditions, and give rise to sub-bandgap states, the electronic structure of a PbS NC was calculated using DFT. A model NC was constructed based on the elemental composition of TBAI-treated NCs, which is measured by wavelength dispersive spectroscopy (WDS) and XPS (Table 1). The Pb-to-S ratio determines the proportion between stoichiometric (100) facets and Pb-terminated (111) facets in a truncated octahedron shape. The final NC used for simulations is 1.95 nm in diameter and consists of 116 Pb atoms, 79 S atoms, and 35 I atoms (FIG. 6A). NCs with iodide ($I^-$) ligands are focused on as they are used in modern, high-performance photovoltaic devices, and the simple structure reduces the computational burden, allowing the simulation of larger NCs.

Figure 7:
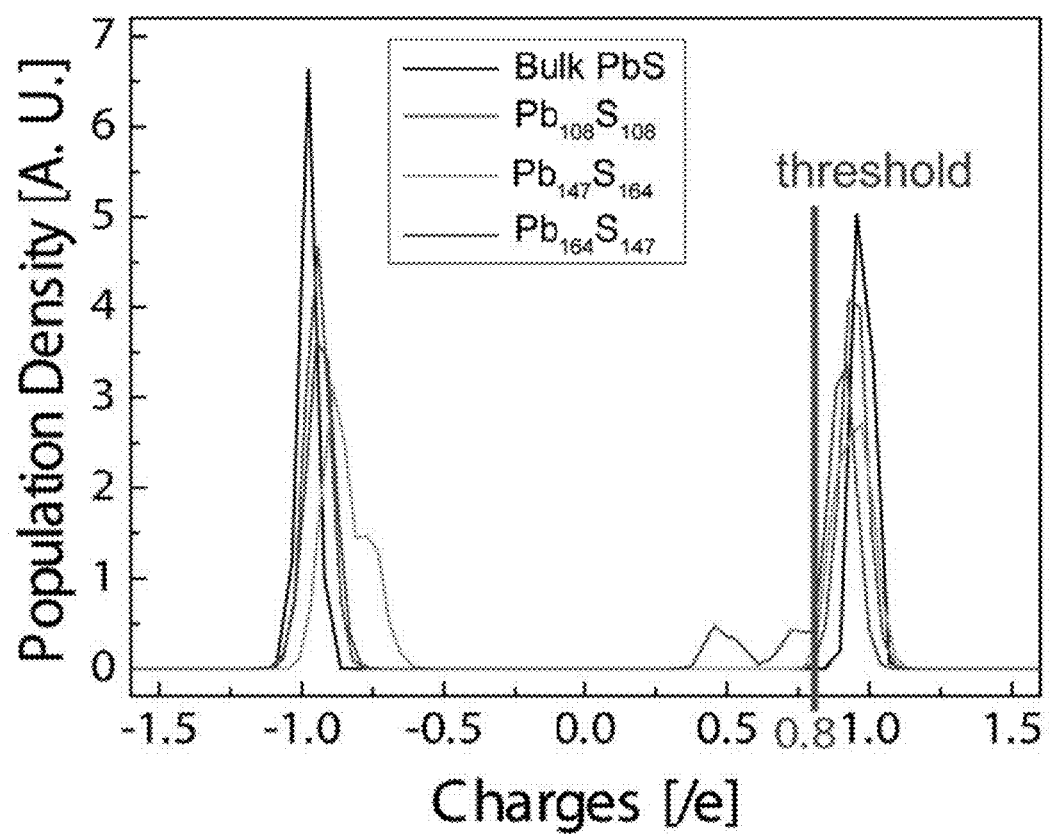
FIG. 7 depicts the simulated charge distribution of different Pb-to-S ratio samples to show that the level of charge threshold for under-charged Pb species is 0.8.

Using this model NC, a Bader charge analysis on the DFT calculation shows the existence of the under-charged Pb atoms. Bader charge analysis is a post-processing method which can partition the continuous charge density along the whole system obtained from DFT so that local charges of individual atoms can be determined. See, for example, G. Henkelman, A. Arnaldsson, H. Jónsson, Comput. Mater. Sci. 2006, 36, 354, which is incorporated by reference in its entirety. FIG. 6B shows the charge distribution—i.e. the atom population density versus local charge—of each atomic species in the constructed particle. For Pb atoms, a major peak in population density is observed at +0.90 (in units of electron charge) with weaker, broader features at lower levels of charge (+0.4-0.75). These broad features in lower ranges indicate the existence of stable, under-charged Pb atoms, which is consistent with the experimental observations using XPS. In comparison, the S atoms and I atoms have single, narrow peaks at −0.90 and at −0.5 electron charges, respectively. It is noted that these values are less than the formal valence charge because the bonds have mixed covalent/ionic nature. For example, as shown in FIG. 7, Pb and S atoms in PbS bulk possess a local charge of about +0.95 and −0.95, respectively.

Figure 8:
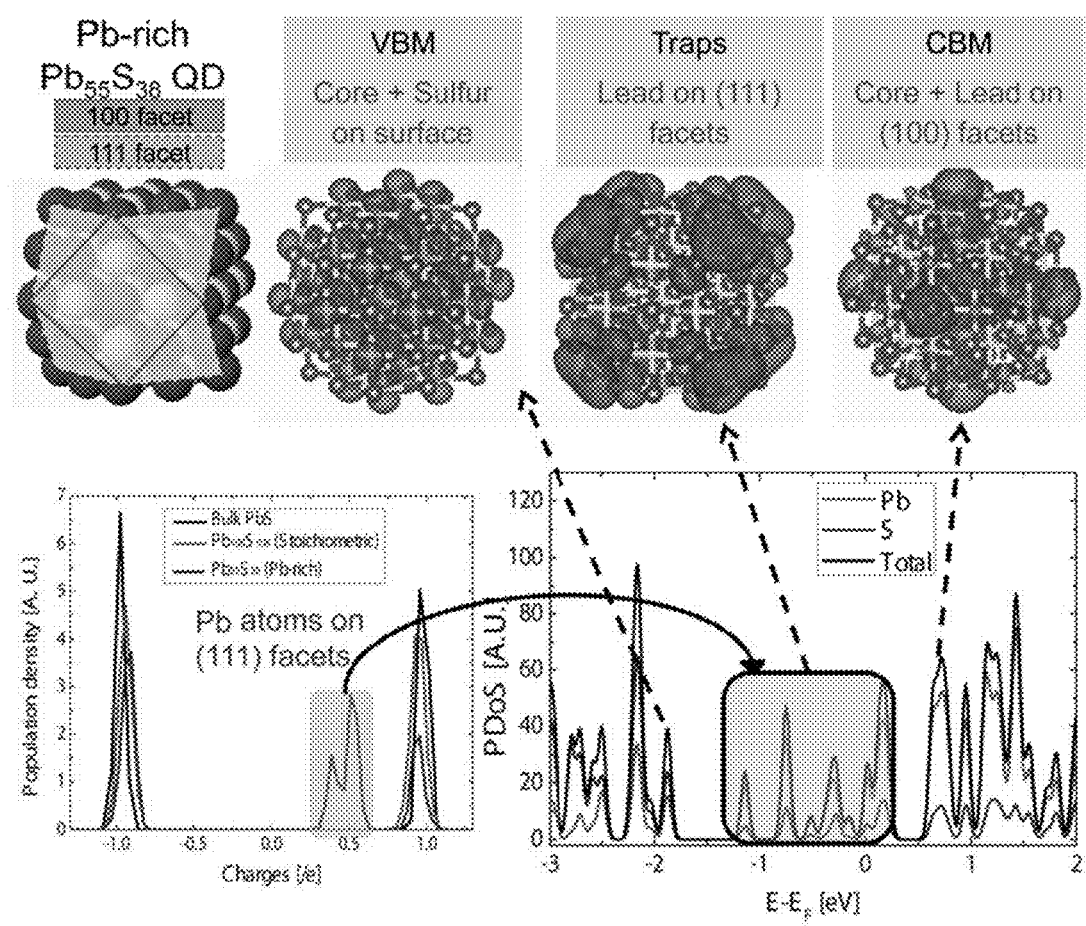
FIG. 8 depicts the DFT results showing that under-charged Pb species are located on the (111) facet, and induce sub-bandgap states.

FIGS. 6C and 6D show the density of states (DoS) for the model NC calculated using DFT. The total DoS (black) reflects all available electronic states, and is broken down into a projected density of states (PDoS) for each atomic species, S (empty square), I (filled circle), and Pb (line with *). The PDoS of Pb atoms is further subdivided into contributions from regular-charged (open triangle) and under-charged Pb atoms (open square). Under-charged Pb atoms were defined as those having a charge less than 0.8 electron charges. This threshold value was suggested by the profile of the atomic population density for Pb in FIG. 6B, and supported by additional Bader charge calculations that showed that neither bulk PbS, nor stoichiometric and sulfur-rich NCs have features in this region (FIG. 7). Returning to the PDoS in FIG. 6D, it is clear that the density of states inside the bandgap arises overwhelmingly from under-charged Pb atoms (<0.8), which is in good agreement with the conclusions from the PL and XPS results shown in FIG. 1. This is an important refinement over a simple 'dangling bond' picture. Additional calculations (FIG. 8) on 'bare' NCs—where all surface Pb atoms have dangling bonds—show that only Pb atoms on (111) surfaces are under-charged and contribute to sub-bandgap states, while Pb atoms on (100) surface are not under-charged and do not contribute to sub-bandgap states.

Figure 9:
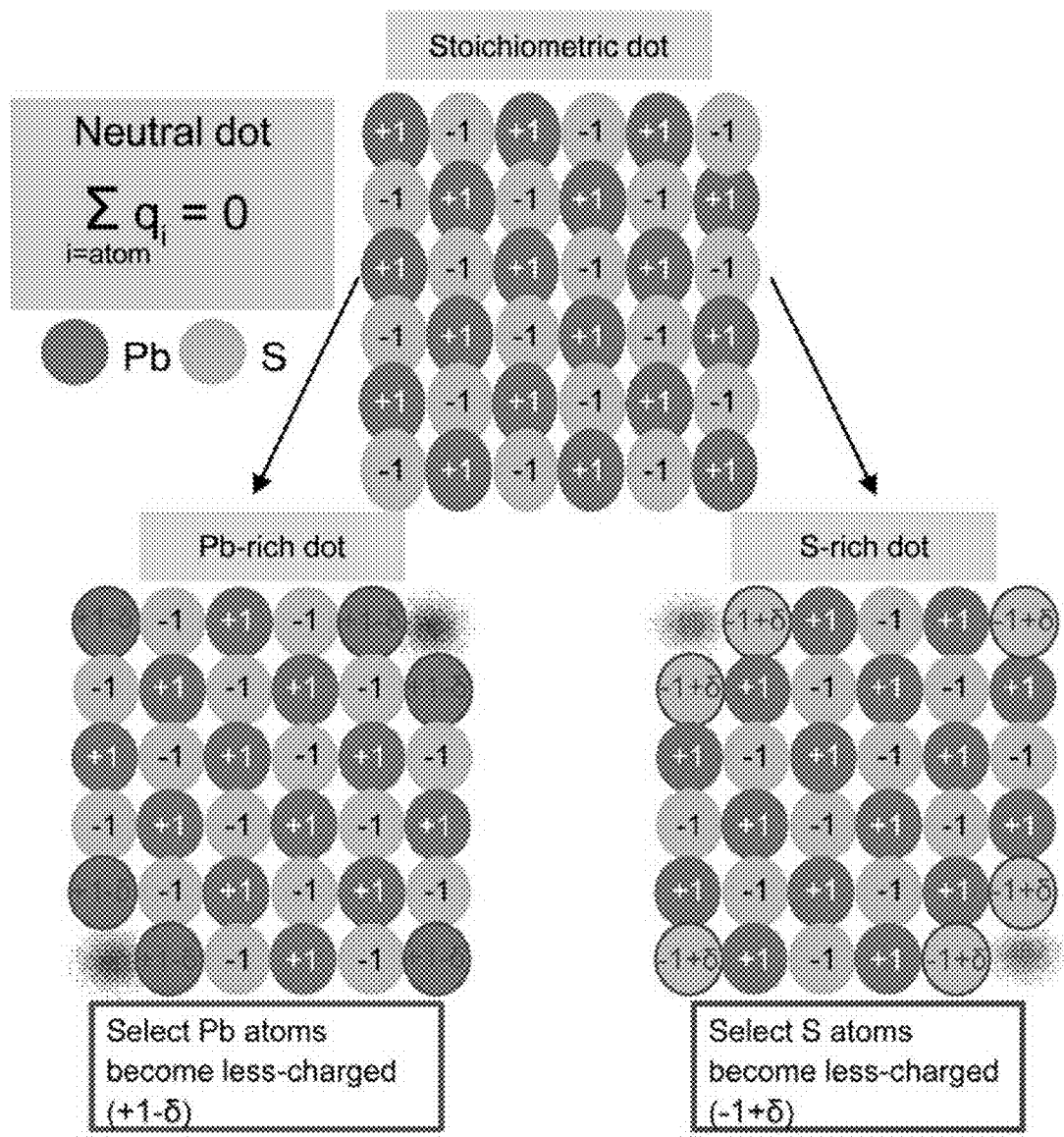
FIG. 9 depicts a schematic illustration of the origin of under-charged species with off-stoichiometry.
Figure 10A:
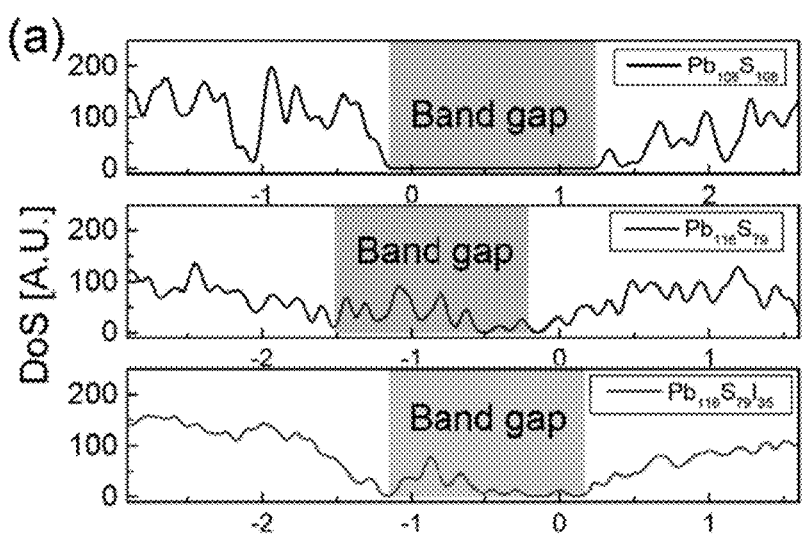
FIG. 10A DoS and FIG. 10B Bader analysis for the comparison of bare NCs and iodine passivated NCs. Iodide ligands suppress under-charged Pb species, and sub-bandgap states in off-stoichiometric PbS NCs. As a reference, calculations on stoichiometric NCs show no sub-bandgap states and no reduced Pb atoms.
Figure 10B:
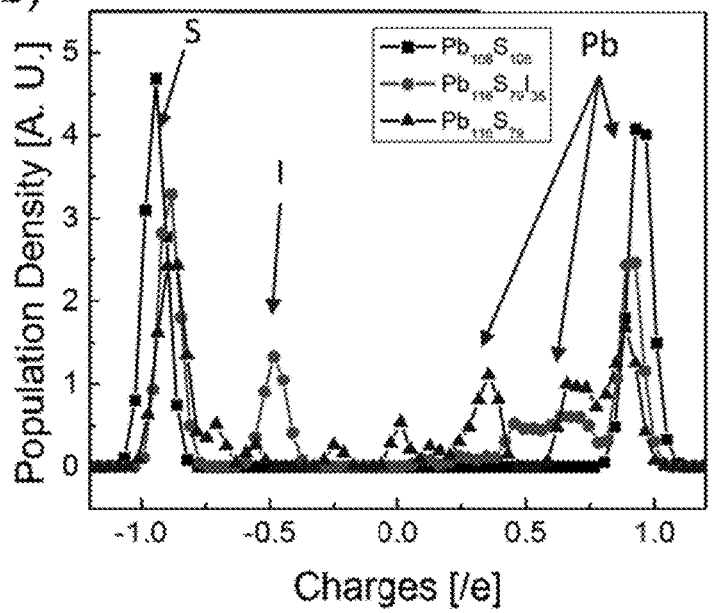
Figure 11B:
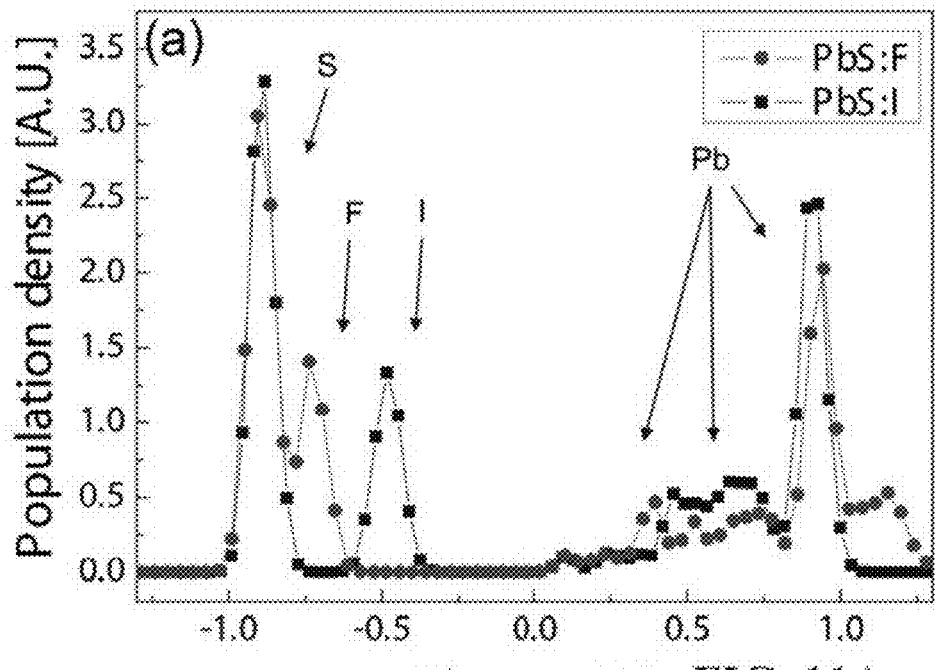
Figure 11B:
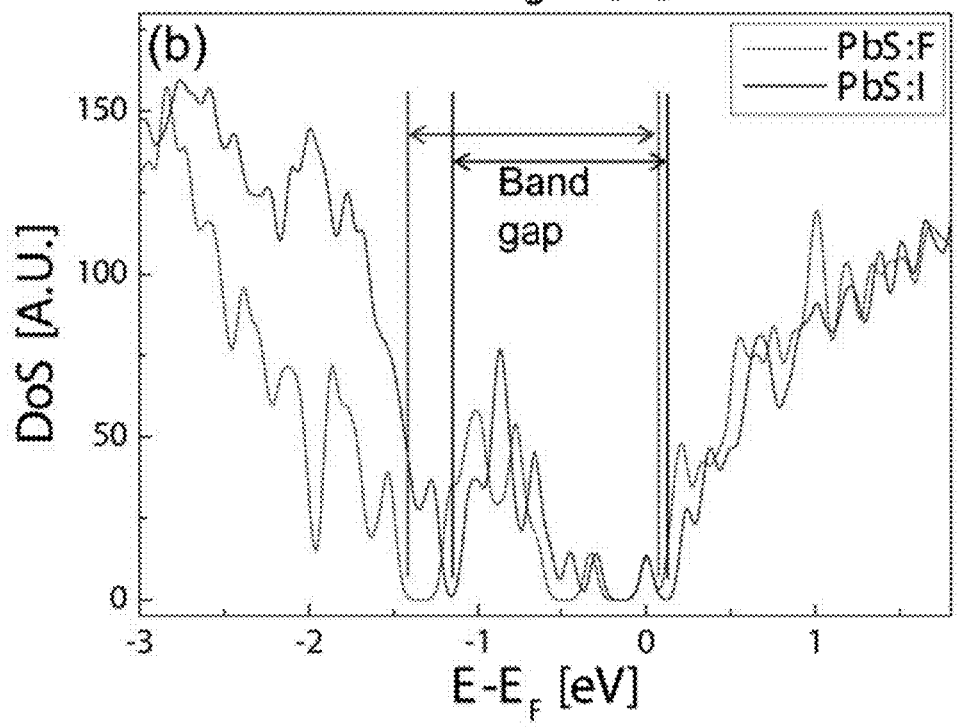

The calculations allow investigating the effect of ligands on the electronic structure of off-stoichiometric (lead-rich) PbS NCs, and provide a fundamental explanation of previous approaches to control trap states with ligand treatments. As shown in Table 1, as-synthesized PbS NCs tend to be lead-rich. See, for example, H. Choi, J. H. Ko, Y. H. Kim, S. Jeong, J. Am. Chem. Soc. 2013, 135, 5278; Y. Justo, L. K. Sagar, S. Flamee, Q. Zhao, A. Vantomme, Z. Hens, ACS Nano 2014, 8, 7948, each of which is incorporated by reference in its entirety. The excess Pb atoms are located on the off-stoichiometric (111) surface (FIG. 8), and calculations on bare (ligand-free) NCs show that overall charge balance is maintained by the under-charged Pb atoms (FIG. 9). However, as shown in FIGS. 10A-10B, the addition of iodine ligands decreases the number of under-charged Pb atoms by contributing partial negative charge. This is consistent with a previous theoretical study that indicates that the level of the suppression depends on ligand coverage. However, it is noted that this cancellation is not expected to be exact under most conditions used in device fabrications. Instead, because the electronegativity of the binding groups determines the amount of partial charge that can be donated, different types of ligands are expected to yield different levels of suppression (FIG. 11A) and a different profile of sub-bandgap states (FIG. 11B). This provides a rationale for the many studies showing that ligands affect the electronic structure and Fermi level of NC thin films. See, for example, O. Voznyy, D. Zhitomirsky, P. Stadler, Z. Ning, S. Hoogland, E. H. Sargent, ACS Nano 2012, 6, 8448; O. Voznyy, S. M. Thon, A. H. Ip, E. H. Sargent, J. Phys. Chem. Lett. 2013, 4, 987; C. Giansante, I. Infante, E. Fabiano, R. Grisorio, G. P. Suranna, G. Gigli, J. Am. Chem. Soc. 2015, 137, 1875; M. T. Frederick, V. A. Amin, E. A. Weiss, J. Phys. Chem. Lett. 2013, 4, 634, each of which is incorporated by reference in its entirety.

Finally, electrical measurements were employed to demonstrate that BQ treatment effectively removes electrically-active trap states, and does not simply suppress the spectroscopically-observed trap emission by causing the trap states to become wholly non-radiative. The density of trap states was measured using drive-level capacitance profiling (DLCP), a technique originally developed for materials possessing a large number of defects, such as amorphous silicon and poly-crystalline $CuIn_xGa_{1-x}Se_2$. See, for example, J. T. Heath, J. D. Cohen, W. N. Shafarman, J. Appl. Phys. 2004, 95, 1000; C. E. Michelson, A. V. Gelatos, J. D. Cohen, Appl. Phys. Lett. 1985, 47, 412, each of which is incorporated by reference in its entirety. DLCP was chosen over commonly-used deep-level transient spectroscopy (DLTS) because conventional DLTS can be only used for materials with sufficiently low defect concentrations to ensure the exponential decay of capacitance, and NC films have a larger density of traps than the density of free carriers. See, for example, D. Bozyigit, M. Jakob, O. Yarema, V. Wood, ACS Appl. Mater. Interfaces 2013, 5, 2915; P. Blood, J. W. Orton, The Electrical Characterization of Semiconductors: Majority Carriers and Electron States, Academic Press, 1992; D. K. Schroder, Semiconductor Material and Device Characterization, John Wiley & Sons, Inc., 2006, each of which is incorporated by reference in its entirety. In DLCP, the density of trap states is measured by analyzing the capacitance response—which depends on the depletion width in Schottky diodes—at different modulation amplitudes and frequencies. Conductive and trap states can be distinguished by their frequency responses. Under high-frequency modulation, only free carriers in conductive states contribute to the capacitance, because carriers do not have enough time to interact significantly with trap states. By contrast, in the low-frequency regime, carriers do have enough time to occupy and de-trap from sub-bandgap states, so both conductive and trap states contribute to the capacitance. The threshold frequency where carriers start interacting with trap states is determined by the characteristic energy level of the trap states and the temperature.

Figure 12A:
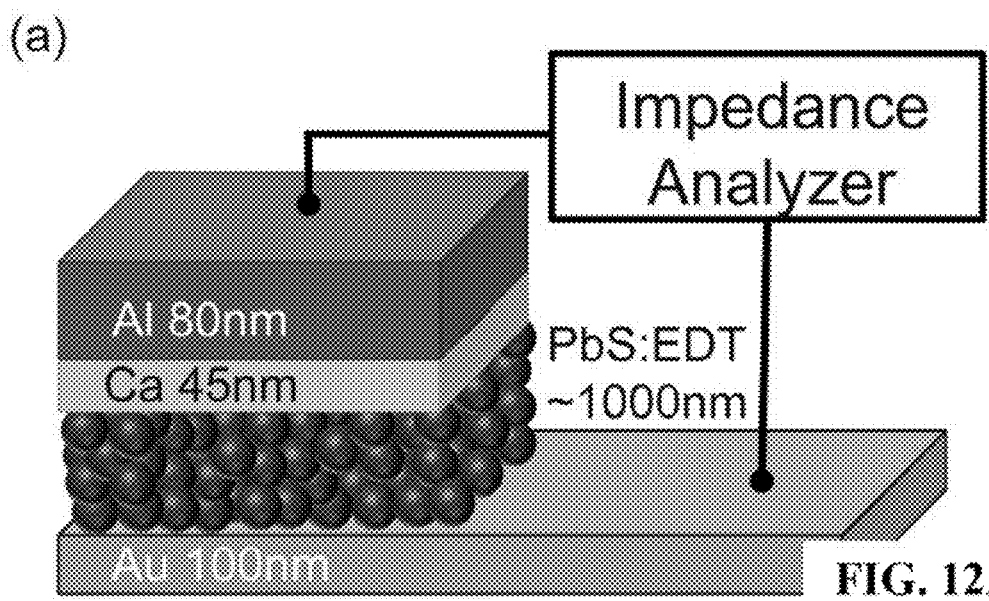
FIG. 12A depicts a schematic of the Schottky diodes used for the DLCP measurements.
Figure 12B:
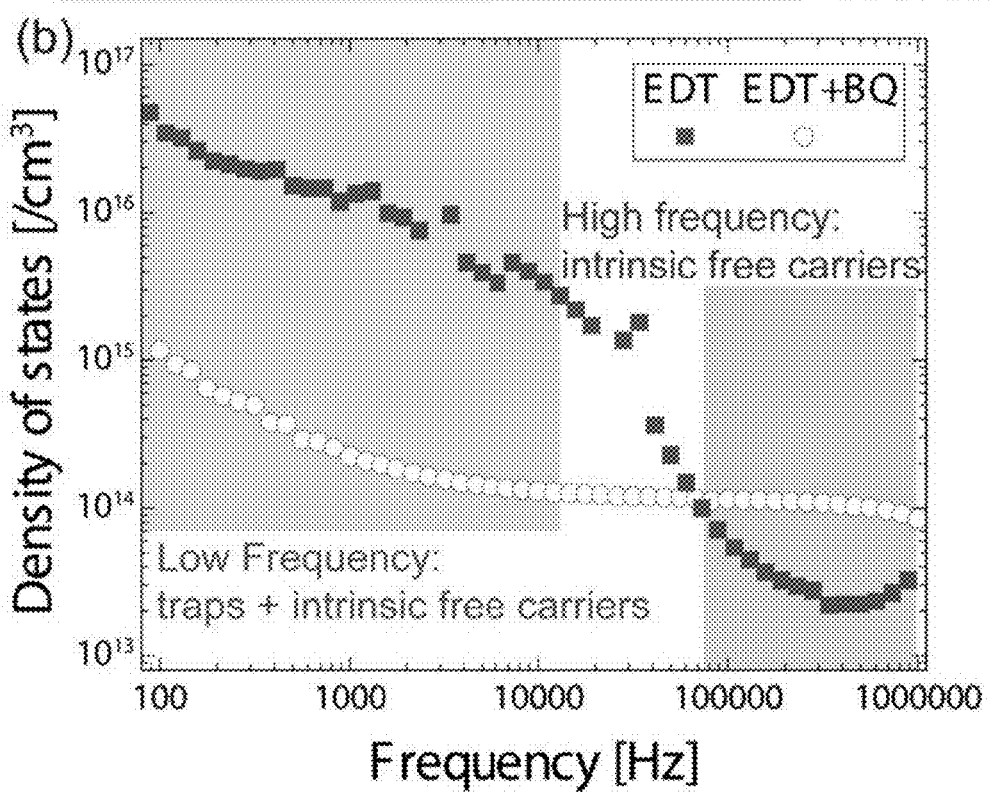
FIG. 12B depicts DLCP measurement of the density of states of EDT-treated PbS films with and without the BQ treatment.

The structure of Schottky diodes used in the DLCP measurement is shown in FIG. 12A. Density of trap states of EDT-treated PbS NC films with and without BQ treatment were compared, and the results were presented in FIG. 12B. Prior to BQ treatment, it was observed that there is a much greater density of available states at low modulation frequencies compared to the high-frequency regime, which is consistent with the presence of trap states. It is found that the absolute density of trap states is $4.8 \times 10^{16}/cm^3$ (~$2.7 \times 10^{-3}$/dot), which is in agreement with values measured using other methods. After oxidation, the low-frequency feature is strongly diminished, and the analysis shows a 40-fold decrease of trap density to $1.2 \times 10^{15}/cm^3$—a level of suppression that is expected to yield a 6-fold improvement in the carrier diffusion length. Therefore, not only that oxidation by BQ effectively reduces the density of trap states, but also that the emissive sub-bandgap states induced by ligand exchange are electrically active. Further, the alternative explanation was ruled out that oxidation by BQ only suppresses trap emission by rendering the states totally non-radiative—the DLCP results show that the sub-bandgap states have been removed.

However, it appears that this BQ treatment also has other, more subtle, effects on the films. Examining the high-frequency region of the DLCP measurements presented in FIG. 12B, it is observed that that the treatment leads to an increase in the density of intrinsic free carriers. This suggests that the treatment may alter the dynamics of spontaneous (thermally-activated) carrier generation, which may influence the fate of photoexcited excitons. This effect may be partially responsible for the 10-40% decrease in the time-integrated photoluminescence quantum yield of films following treatment, although further experiments will be required to reveal the respective roles of geminate, bimolecular, and trap-assisted recombination dynamics in these films.

The chemical origin of sub-bandgap states in ligand exchanged PbS NC thin films was identified using a combined experimental/theoretical approach. It is shown experimentally that under-charged Pb atoms result from ligand exchange, and are associated with sub-bandgap states that are both optically and electrically active. Theoretical calculations using DFT and Bader charge analysis confirm that under-charged Pb atoms give rise to sub-bandgap states. It is discovered that treatment with BQ re-oxidizes these under-charged Pb atoms and suppresses trap emission, and then use DLCP to show quantitatively that it achieves 40-fold decrease in the density of trap states. The insights developed in this paper on the fundamental origin of trap formation can provide direction for controlling the density of trap states in thin films of NCs, and thereby improve the performance of NC devices.

Figure 13:
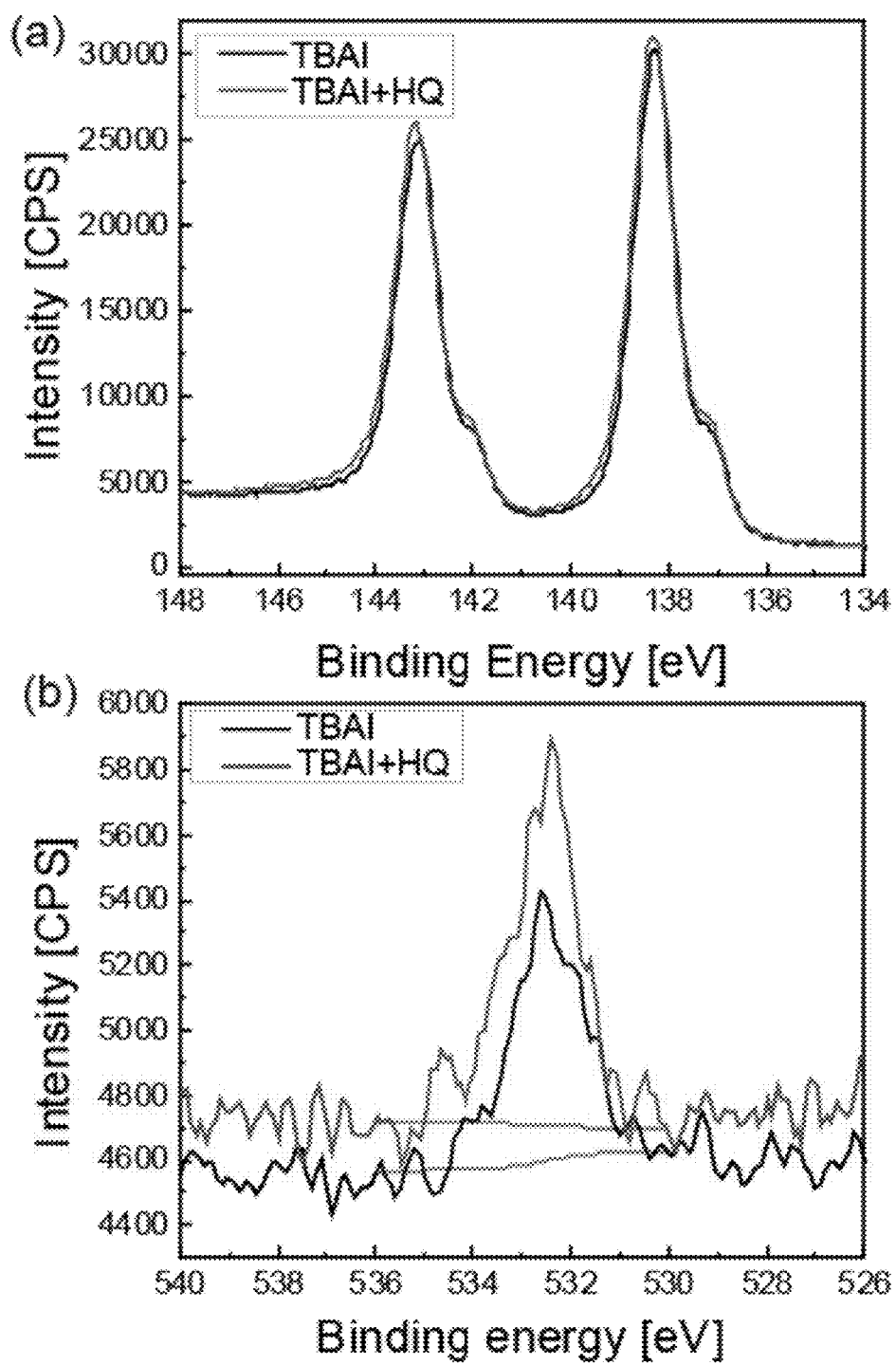
FIG. 13 depicts XPS results of TBAI-treated samples with and without 1,4-hydroquinone (HQ) treatment.
Figure 14:
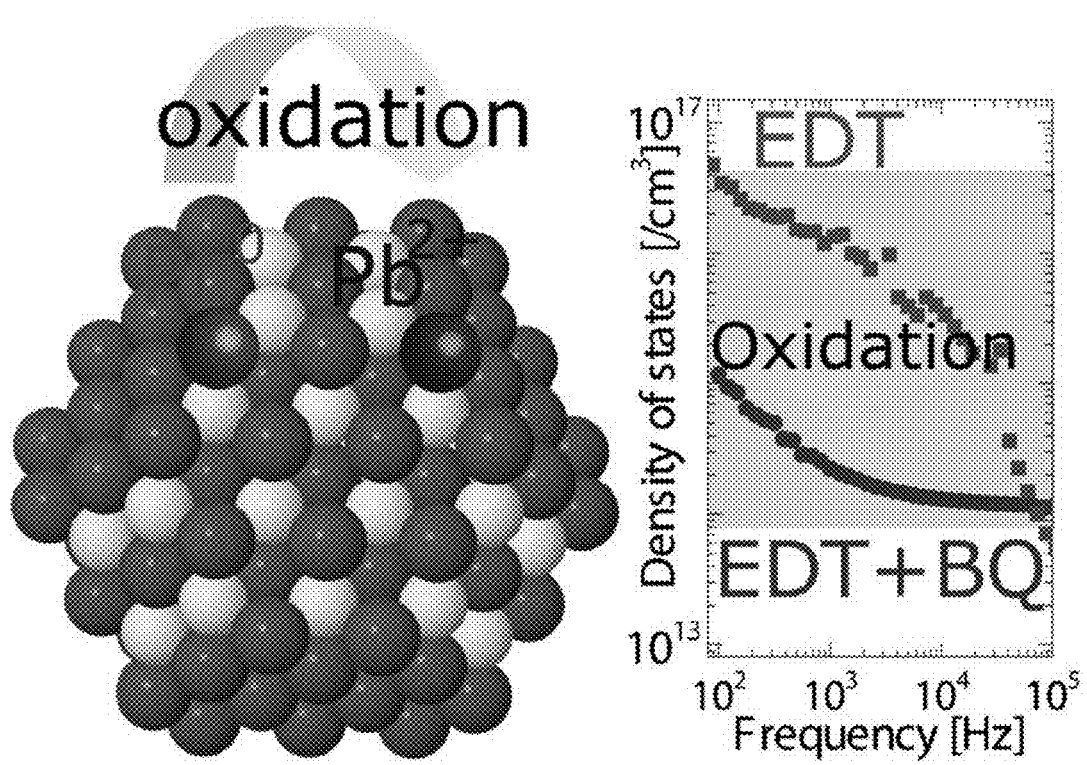
FIG. 14 depicts a schematic showing oxidation of under-charged Pb atoms reduces the density of trap states.

FIG. 13 depicts XPS results of TBAI-treated samples with and without 1,4-hydroquinone (HQ) treatment. HQ is a product from the reduction of BQ. Minimal change in the spectral features of (panel a) Pb 4f and (panel b) O 1s is observed before and after the HQ treatment. This result indicates limited binding of HQ on the NC surface. O-to-Pb ratio with background correction increases 9% after the HQ treatment. It is suspected that oxygen in the samples are originated from residual OA ligands or air-exposures during the sample transfer to XPS chamber. The low frequency regime (square box) includes contributions from carriers interacting with conductive and trap states, while the high frequency regime (circle box) gives the density of conductive states only. FIG. 14 depicts a schematic showing oxidation of under-charged Pb atoms reduces the density of trap states.

Example

Sample Preparation:

Synthesis and fabrication procedures are performed under nitrogen atmosphere using Schlenk line techniques and gloveboxes. OA-capped PbS NCs are synthesized using a literature method and purified three times by precipitation in a mixture of ethanol and 1-butanol, followed by centrifugation and re-suspension in hexane. See, for example, C.-H. M. Chuang, P. R. Brown, V. Bulović, M. G. Bawendi, Nat. Mater. 2014, 13, 796; M. A. Hines, G. D. Scholes, Adv. Mater. 2003, 15, 1844, each of which is incorporated by reference in its entirety. OA-capped NC and nBA treated NCs are drop-cast to form a film. Solution-phase ligand exchange of nBA is performed by the following steps: After a further precipitation, PbS NCs are dissolved into nBA with a concentration of 25 mg/mL and the solution is stirred overnight. Films are fabricated by drop-casting. NC solutions at a concentration of 50 mg/mL in octane are used for spin-casting. EDT, TBAI, nBA and MPA treated NC films are prepared by sequential spin-casting. For each layer, 20 µL of NC solution is spin-cast at 1500 rpm for 30 s on a Si substrate. Roughly 0.1 mL of ligand solution is then dispensed onto the substrate, allowed to sit for 30 s, and spun dry. The substrate is then washed with the excess solvent used for ligand exchange and spun dry three times to remove unbound ligands, and the entire process is repeated; each complete iteration results in the deposition of ~20 nm of NCs. The ligand concentrations and solvents used in this study are EDT 0.02% (v/v) in acetonitrile, TBAI 10 mg/mL in methanol, and MPA 1% (v/v) in methanol. For the selected films, the oxidation process is performed between layer depositions. Roughly 0.1 mL of 10 mg/mL BQ solution in methanol is dispensed onto the ligand-exchanged films, allowed to sit for 30 s, and spun dry followed by three sequential washes with methanol.

Characterization:

PL measurements were conducted at a room temperature with 532 nm diode laser excitation. [3.0 mW into a ~135 µm spot ($1/e^2$ diameter) for an irradiance of ~150 mW/cm$^2$] The photoluminescence was collected using reflective optics, passed through a long-pass filter (3 mm Schott RG780) to remove pump scatter, spectrally dispersed using an Acton 300i spectrometer, and measured using an InGaAs array detector (Roper Scientific). XPS measurements were performed using a PHI Versaprobe II X-ray Photoelectron Spectrometer, and the spectra were analyzed using CasaXPS software. WDS measurements were performed using a JEOL JXA-8200 SuperProbe. DLCP measurement was performed using a Solartron 1260 impedance analyzer, in a nitrogen glove box.

Density Functional Theory Calculations:

DFT calculations were performed using the Vienna Ab initio Simulation Packages (VASP) with the generalized gradient approximation of Perdew-Burke-Ernzerhof (PBE) for the exchange and correlation functional. See, for example, G. Kresse, J. Furthmüller, Comput. Mater. Sci. 1996, 6, 15; J. P. Perdew, K. Burke, M. Ernzerhof, Phys. Rev. Lett. 1996, 77, 3865, each of which is incorporated by reference in its entirety. The projector-augmented-wave method was adopted to describe the core electrons. An energy cutoff of 400 eV and a Monkhorst-Pack k-point sampling of 1×1×1 were used. A large vacuum spacing of >15 Å was used to prevent spurious inter-NC interactions. PbS NCs bearing iodine ligand were fully relaxed using the conjugate gradient method until the structure satisfied the following relaxation criteria: (i) the energy difference between two consecutive ionic steps is less than $10^{-4}$ eV, and (ii) the maximum Hellmann-Feynman forces acting on each atom are less than 0.01 eV·Å$^{-1}$. Bader charge analysis was post-performed on charge density results obtained from DFT in order to calculate local charge that each atom in a NC possess.

Other embodiments are within the scope of the following claims.

What is claimed is:

1. A method of modifying a surface of nanocrystal including contacting a surface of the nanocrystal with an oxidizing agent, wherein the nanocrystal is a Group II-VI compound, a Group II-V compound, a Group III-VI compound, a Group III-V compound, a Group IV-VI compound, a Group I-III-VI compound, a Group II-IV-VI compound, or a Group II-IV-V compound, treating the surface with the oxidizing agent until a density of trap states for the nanocrystal having the oxidized surface compared to the nanocrystal having an untreated surface is reduced by at least 20-fold and removing under-charged atoms on the surface.

2. The method of claim 1, wherein the nanocrystal includes Pb.

3. The method of claim 1, wherein the nanocrystal includes S.

4. The method of claim 1, wherein the nanocrystal includes Se.

5. The method of claim 1, wherein the oxidizing agent is selected from the group consisting of 1, 4-benzoquinone, dithiothreitol, 2,3-dichloro-5,6-dicyanobenzoquinone, 3,3', 5,5'-tetra-tert-butyldiphenoquinone, di-tert-butyl peroxide, $I_2$, $I_2/I^-$ ($I_3^-$), chlorine gas, bromine, ozone, $O_2$ plasma treatment, and an acid, or combinations thereof.

6. The method of claim 1, wherein the oxidizing agent is pyruvic acid and the method includes annealing.

7. The method of claim 1, wherein contacting a surface of the nanocrystal with the oxidizing agent to oxidize metal atom of the nanocrystal atoms at the surface.

8. A method of treating a film that includes nanocrystal comprising contacting a surface of the nanocrystal with an oxidizing agent, wherein the nanocrystal is a Group II-VI compound, a Group II-V compound, a Group III-VI compound, a Group III-V compound, a Group IV-VI compound, a Group I-III-VI compound, a Group II-IV-VI compound, or a Group II-IV-V compound, forming a modified surface in which a density of trap states for the nanocrystal having the oxidized surface compared to the nanocrystal having an untreated surface is reduced by at least 20-fold and removing under-charged atoms on the film with the oxidizing agent.

9. The method of claim 8, wherein the nanocrystal includes Pb.

10. The method of claim 8, wherein the nanocrystal includes S.

11. The method of claim 8, wherein the nanocrystal includes Se.

12. The method of claim 8, wherein the oxidizing agent is selected from the group consisting of 1, 4-benzoquinone, dithiothreitol, 2,3-dichloro-5,6-dicyanobenzoquinone, 3,3', 5,5'-tetra-tert-butyldiphenoquinone, di-tert-butyl peroxide, $I_2$, $I_2/I^-$ ($I_3^-$), chlorine gas, bromine, ozone, $O_2$ plasma treatment, and an acid, or combinations thereof.

13. The method of claim 8, wherein the oxidizing agent is pyruvic acid and the method includes annealing.

14. The method of claim 8, wherein contacting a surface of the nanocrystal with the oxidizing agent to oxidize metal atom of the nanocrystal atoms at the surface.

15. The method of claim 8, wherein contacting the surface of the nanocrystal with the oxidizing agent is dispensing the oxidizing agent onto the film.

16. The method of claim 1, wherein the oxidizing agent is selected from the group consisting of $H_2SO_4$, $HNO_3$, 1, 4-benzoquinone, dithiothreitol, 2,3-dichloro-5,6-dicyanobenzoquinone, 3,3',5,5'-tetra-tert-butyldiphenoquinone, di-tert-butyl peroxide, $I_2$, $I_2/I^-$ ($I_3^-$), and pyruvic acid.

17. The method of claim 8, wherein the oxidizing agent is selected from the group consisting of $H_2SO_4$, $HNO_3$, 1, 4-benzoquinone, dithiothreitol, 2,3-dichloro-5,6-dicyanobenzoquinone, 3,3',5,5'-tetra-tert-butyldiphenoquinone, di-tert-butyl peroxide, $I_2$, $I_2/I^-$ ($I_3^-$), and pyruvic acid.

18. The method of claim 1, wherein the oxidizing agent is selected from the group consisting of 1, 4-benzoquinone, dithiothreitol, 2,3-dichloro-5,6-dicyanobenzoquinone, 3,3',5,5'-tetra-tert-butyldiphenoquinone, di-tert-butyl peroxide, $I_2$, $I_2/I^-$ ($I_3^-$), bromine, ozone, and an acid, or combinations thereof.

19. The method of claim 8, wherein the oxidizing agent is selected from the group consisting of 1, 4-benzoquinone, dithiothreitol, 2,3-dichloro-5,6-dicyanobenzoquinone, 3,3',5,5'-tetra-tert-butyldiphenoquinone, di-tert-butyl peroxide, $I_2$, $I_2/I^-$ ($I_3^-$), bromine, ozone, and an acid, or combinations thereof.

\* \* \* \* \*